United States Patent [19]
Baik

[11] Patent Number: 6,146,965
[45] Date of Patent: Nov. 14, 2000

[54] METHODS OF FORMING INTEGRATED CIRCUIT CAPACITORS USING MASK PATTERNS HAVING CONSTRICTED NECK REGIONS

[75] Inventor: Ihn-gee Baik, Kyonggi-do, Rep. of Korea

[73] Assignee: Samsung Electronics Co., Ltd., Rep. of Korea

[21] Appl. No.: 09/349,043

[22] Filed: Jul. 7, 1999

[30] Foreign Application Priority Data

Jul. 7, 1998 [KR] Rep. of Korea ...................... 98-27219

[51] Int. Cl.$^7$ .................................................. H01L 21/20
[52] U.S. Cl. .......................... 438/397; 438/254; 438/253; 438/396; 257/306
[58] Field of Search ................................... 438/239, 398, 438/253, 254, 396, 397

[56] References Cited

U.S. PATENT DOCUMENTS 5,879,984 3/1999 Shin et al. .............................. 438/253
5,932,333 8/1999 Lee ......................................... 428/255

OTHER PUBLICATIONS

Wolf et al., Silicon Processing for the VLSI Era, vol. 1, Process Technology, chapter 16, pp. 554–557, 1986.

Primary Examiner—Mary Wilczewski
Assistant Examiner—Calvin Lee
Attorney, Agent, or Firm—Myers Bigel Sibley & Sajovec

[57] ABSTRACT

Methods of forming integrated circuit capacitors include the steps of forming a first electrically conductive layer (e.g., polysilicon layer) on a substrate and then forming a masking layer on the first electrically conductive layer. The masking layer is then patterned to define an electrode mask having a constricted neck region therein with reduced transverse cross-sectional area (e.g., reduced width). A step is then performed to etch the first electrically conductive layer using the electrode mask as an etching mask. Upon performance of this etching step, a storage electrode is defined having a constricted neck region therein with reduced transverse cross-sectional area (e.g., reduced width and height). Notwithstanding the reduced cross-sectional area of the constricted neck region, the overall surface area of the storage electrode is increased relative to an electrode having the same general shape but no constricted neck region. For example, the electrode mask may be patterned in the shape of a "bow tie" having a central constricted neck region that is thinner than opposing ends of the mask. An etching step then is performed so that the bow tie shape of the electrode mask is reproduced in the storage electrode. The thickness of the storage electrode may also be reduced in the constricted neck region. As a result, the preferred storage electrode will have a greater surface area than a rectangular shaped electrode having the same general length, width and thickness.

7 Claims, 5 Drawing Sheets

METHODS OF FORMING INTEGRATED CIRCUIT CAPACITORS USING MASK PATTERNS HAVING CONSTRICTED NECK REGIONS

FIELD OF THE INVENTION

The present invention relates to methods of forming integrated circuits and circuits formed thereby, and more particularly to methods of forming integrated circuit capacitors and capacitors formed thereby.

BACKGROUND OF THE INVENTION

The demand for higher capacity semiconductor memory devices has resulted in improved techniques to form memory devices and structures therein at higher levels of integration. However, because higher levels of integration typically require memory devices having smaller unit cell size, the area occupied by a cell capacitor in a memory device, such as a DRAM device, may have to be reduced significantly. As will be understood by those skilled in the art, this reduction in cell capacitor area can degrade memory cell performance at low voltages and adversely impact soft-error rate (SER) caused by α-particle radiation.

Conventional methods of increasing cell capacitor surface area include forming cell capacitor electrodes (e.g., storage electrodes) with hemispherical grain (HSG) silicon surface layers. For example, a conventional method of forming HSG silicon surface layers on cell capacitor electrodes is disclosed in U.S. Pat. No. 5,407,534 to Thakur. However, while capacitors having HSG surface layers therein have manifested enhanced capacitance in high density integrated circuits, HSG capacitors may lack stability and may incur performance degradation over the lifetime of an integrated circuit memory device. Other methods of increasing cell capacitor area include the use of trench-based capacitor electrodes. Unfortunately, the processing techniques typically used to form these types of electrodes are complex.

Thus, notwithstanding the above-described methods, there continues to be a need for improved methods of forming integrated circuit capacitors.

SUMMARY OF THE INVENTION

It is therefore an object of the present invention to provide improved methods of forming integrated circuit capacitors and capacitors formed thereby.

It is still another object of the present invention to provide methods of forming integrated circuit capacitors having electrodes with increased surface area, and capacitors formed thereby.

These and other objects, advantages and features of the present invention are provided by methods of forming integrated circuit capacitors which include the steps of forming a first electrically conductive layer (e.g., polysilicon layer) on a substrate and then forming a masking layer on the first electrically conductive layer. The masking layer is then patterned to define an electrode mask having a constricted neck region therein with reduced transverse cross-sectional area (e.g., reduced width). A step is then performed to etch the first electrically conductive layer using the electrode mask as an etching mask. Upon performance of this etching step, a storage electrode is defined having a constricted neck region therein with reduced transverse cross-sectional area (e.g., reduced width and height). Notwithstanding the reduced cross-sectional area of the constricted neck region, the overall surface area of the storage electrode is increased relative to an electrode having the same general shape but no constricted neck region. For example, the electrode mask may be patterned in the shape of a "bow tie" having a central constricted neck region that is thinner than opposing ends of the mask. An etching step then is performed so that the bow tie shape of the electrode mask is reproduced in the storage electrode. The thickness of the storage electrode may also be reduced in the constricted neck region. As a result, the preferred storage electrode will have a greater surface area than a rectangular shaped electrode having the same general length, width and thickness.

According to a preferred aspect of the present invention, the etching step is of sufficient duration to etch away the constricted neck region of the electrode mask and thereby separate the electrode mask into at least two noncontiguous mask segments that cover respective end portions of the storage electrode. This step is preferably performed so that an upper surface of the storage electrode in the constricted neck region is exposed directly to the etchant and the thickness of the electrode in this region is reduced. This reduction in thickness also leads to an increase in the surface area of the electrode and a concomitant increase in the capacitance of the resulting capacitor. The resulting capacitor is obtained by forming a dielectric layer on the storage electrode and then forming a plate electrode (e.g., upper electrode) on the dielectric layer.

DESCRIPTION OF PREFERRED EMBODIMENTS

Figure 1:
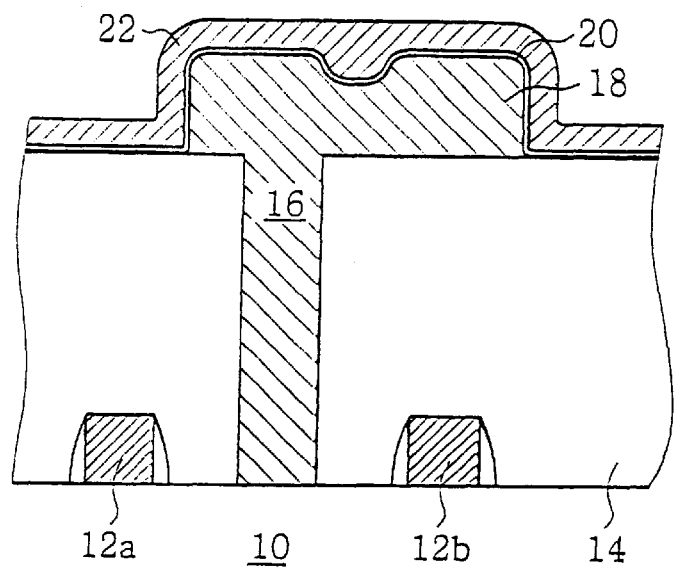
FIG. 1 is a cross-sectional view of an integrated circuit capacitor according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
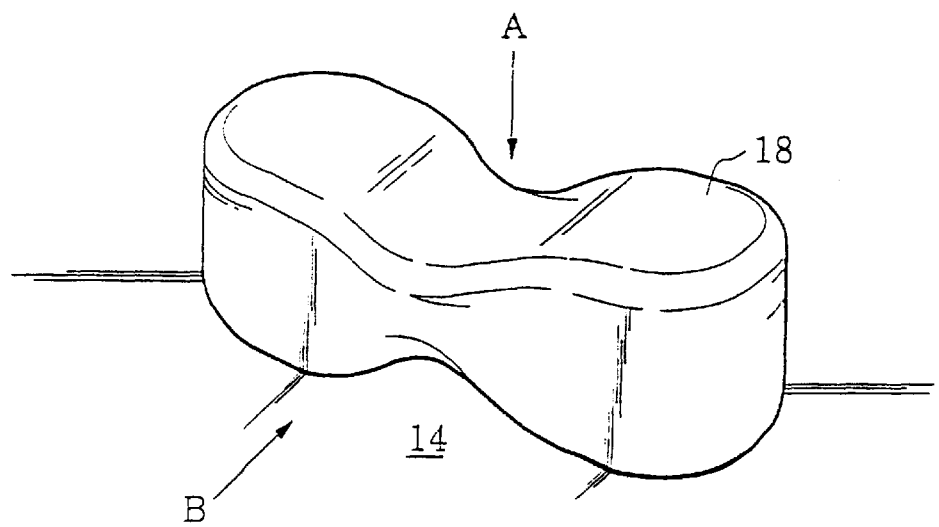
FIG. 2 is a perspective view of a storage electrode having a central constricted neck region of reduced thickness (measured in the direction of arrow A) and a reduced width (measured in the direction of arrow B), according to the present invention.
Figure 3A:
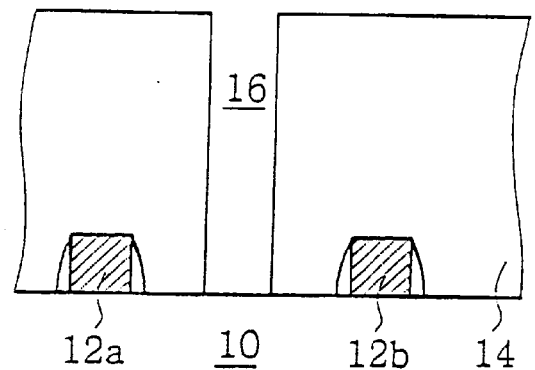
FIGS. 3A–3F are cross-sectional views of intermediate structures that illustrate a preferred method of forming a storage electrode according to a preferred aspect of the present invention.

Referring now to FIGS. 1–2, 3A–3F, 4A–4B and 5, preferred methods of forming integrated circuit capacitors according to the present invention will be described. In particular, FIG. 3A illustrates the steps of forming an electrically insulating layer 14 having a storage node contact hole 16 therein on a substrate (not shown). Word lines 12a and 12b of an integrated circuit memory device may also be provided on the substrate, as illustrated. The electrically insulating layer 14 may comprise an oxide, borophosphosilicate glass (BPSG), phosphosilicate glass (PSG) or undoped silicate glass (USG), for example. The storage node contact hole 16 may also be formed in the electrically insulating layer 14 using conventional photolithographically defined masking and etching steps. For example, a dry etching step using a plasma may be performed to define a storage node contact hole 16 having a critical dimension.

Figure 3B:
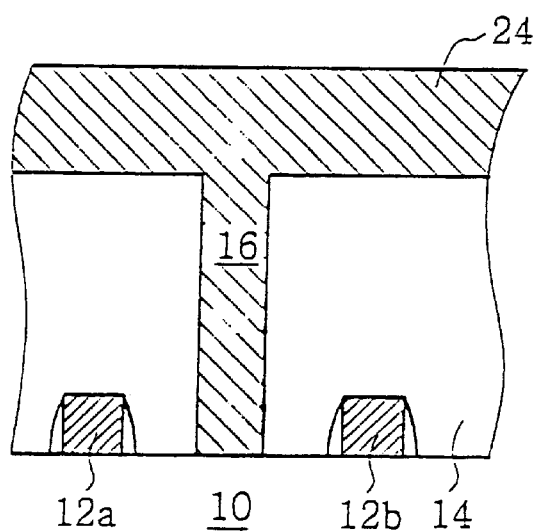
Figure 3C:
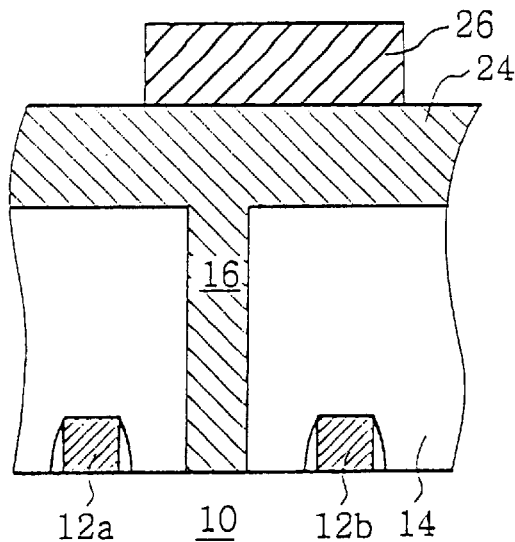
Figure 4A:
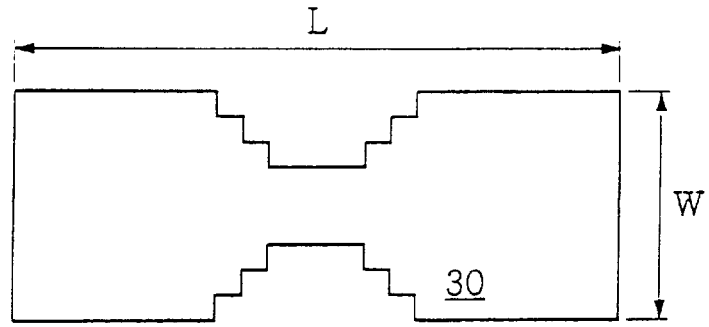
FIG. 4A illustrates a photolithography mask pattern which can be used to photolithographically define an electrode mask according to the present invention.
Figure 4B:
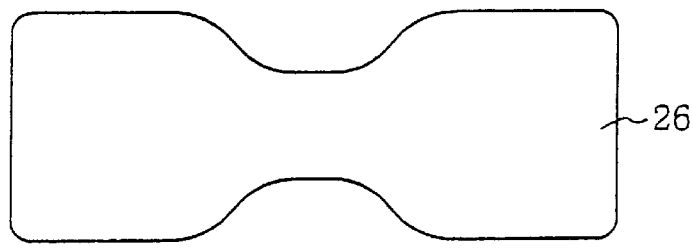
FIG. 4B is a plan view of an electrode mask according to the present invention.
Figure 5:
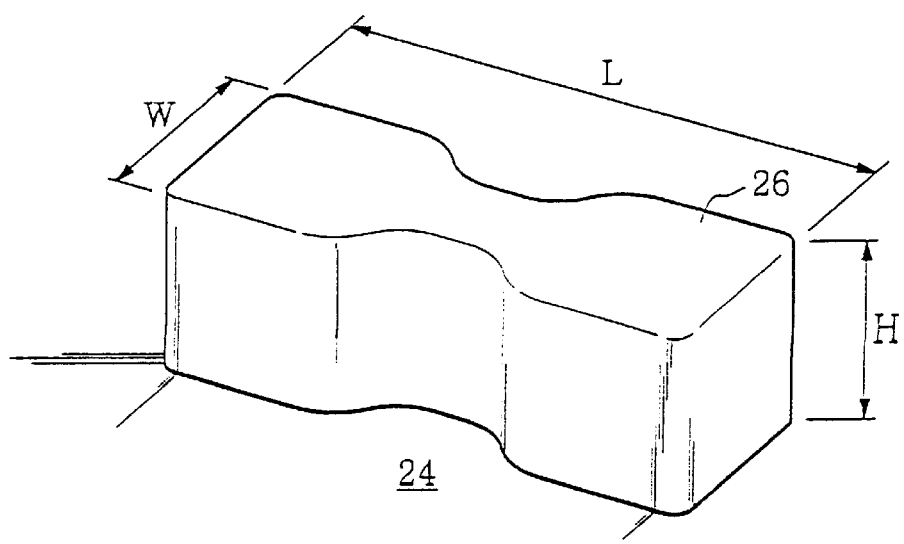
FIG. 5 is a perspective view of the electrode mask of FIG. 4B.

As illustrated by FIG. 3B, a step is then performed to deposit a blanket layer 24 of an electrically conductive material. For example, a layer of polysilicon having a predetermined thickness may be deposited using a chemical vapor deposition (CVD) step. Referring now to FIG. 3C, a blanket layer of a masking material (e.g., photoresist) may then be deposited on the electrically conductive material. Using conventional photolithography steps, this blanket layer of a masking material may then be patterned as an electrode mask 26 having a rectangular cross-section in a longitudinal direction, as illustrated by FIG. 3C. However, as illustrated by the plan layout view of FIG. 4B and the perspective view of FIG. 5, the electrode mask 26 may be photolithographically patterned in the shape of a bow tie having a thickness or height "H", a length "L" and width "W". The front and rear faces of the electrode mask 26 of FIG. 5 also have opposing U-shaped recesses therein that define a constricted neck region. FIG. 4A illustrates the photolithography mask pattern 30 that can be used to pattern the masking material as the electrode mask 26.

Figure 3D:
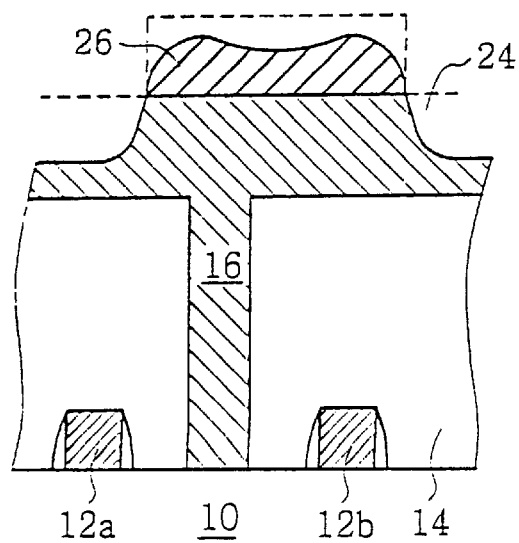
Figure 3E:
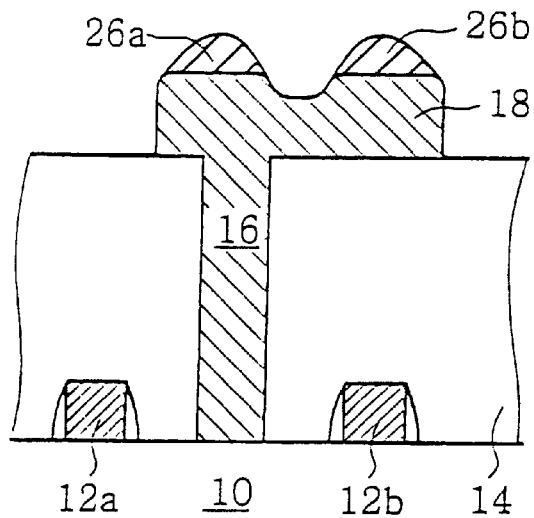
Figure 3F:
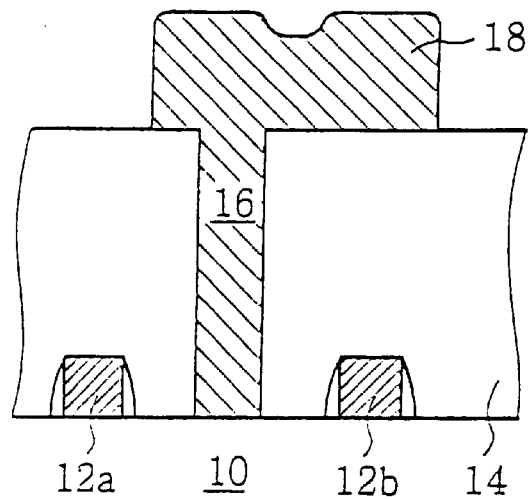

Referring now to FIGS. 3D–3F, a dry-etching step can then be performed to etch the blanket layer 24 of electrically conductive material. During the dry-etching step, the electrode mask 26 is also etched. In fact, the etching step is preferably of sufficient duration to etch away the constricted neck region of the electrode mask 26 and thereby separate the electrode mask 26 into at least two noncontiguous mask segments 26a, 26b that cover respective portions of the resulting storage electrode 18. This separation takes place because the reduced amount of photoresist in the neck region is consumed by the dry etchant before the ends of the mask 26 are fully consumed. Because of this separation, a central recess is also formed in an upper surface of the storage electrode 18 since the central region is exposed directly to the dry etchant. Preferably, the duration of the etching step is carefully chosen to obtain a desired recess depth in view of the thickness of the layer of material used to form the storage electrode.

Referring now to FIGS. 2 and 3F, the remaining segments 26a and 26b of the electrode mask are then removed using conventional techniques. As illustrated, the surface area of the resulting storage electrode 18 is increased because the central constricted neck region has reduced thickness (measured in the direction of arrow A) and reduced width (measured in the direction of arrow B). Finally, as illustrated by FIG. 1, a blanket dielectric layer 20 and a blanket plate electrode layer 20 are then formed on the storage electrode 18 to complete the capacitor structure. Accordingly, integrated circuit capacitors can be formed with increased electrode surface area (i.e., increased capacitance) by simply designing the mask pattern 30 to have a constricted neck region and then slightly modifying conventional processing steps to obtain a storage electrode having a constricted neck region of reduced width and thickness.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:

forming a first electrically conductive layer on a substrate;

forming a masking layer on the first electrically conductive layer;

patterning the masking layer to define an electrode mask having a first constricted neck region therein with reduced transverse cross-sectional area; and etching the first electrically conductive layer with an etchant which also etches the electrode mask, the electrode mask acting as an etching mask during the etching of the first electrically conductive layer, to define a storage electrode having a second constricted neck region therein with reduced transverse cross-sectional area;

wherein said etching step is of sufficient duration to etch away the constricted neck region of the electrode mask and thereby separate the electrode mask into at least two noncontiguous mask segments that cover respective portions of the storage electrode.

2. The method of claim 1, wherein the second constricted neck region of the storage electrode is the thinnest portion of the storage electrode.

3. The method of claim 2, wherein the second constricted neck region of the storage electrode is the narrowest portion of the storage electrode.

4. The method of claim 1, further comprising the steps of:

forming a dielectric layer on the storage electrode; and forming a plate electrode on the dielectric layer, opposite the storage electrode.

5. The method of claim 4, wherein said step of forming a first electrically conductive layer is preceded by the steps of forming an electrically insulating layer having a contact hole therein on a surface of the substrate; and wherein said step of forming a first electrically conductive layer comprises the step of depositing a first electrically conductive layer in the contact hole and on an upper surface of first electrically insulating layer.

6. The method of claim 5, wherein the first electrically conductive layer comprises polycrystalline silicon; and wherein said etching step comprises dry-etching the polycrystalline silicon using the electrode mask as an etching mask.

7. A method of forming an integrated circuit capacitor, comprising:

forming an electrically insulating layer on a substrate;

forming a first electrically conductive layer on the electrically insulating layer;

forming a masking layer on the first electrically conductive layer;

etching the masking layer to expose a first portion of the first electrically conductive layer and define an electrode mask that has a first constricted neck region therein which covers a second portion of the first electrically conductive layer extending opposite the constricted neck region; and forming a storage electrode having a second constricted neck region by etching the exposed first portion of the first electrically conductive layer while simultaneously etching the first constricted neck region and the second portion of the first electrically conductive layer in sequence.

* * * * *